United States Patent
Sou et al.

(10) Patent No.: US 6,362,483 B1
(45) Date of Patent: Mar. 26, 2002

(54) VISIBLE-BLIND UV DETECTORS

(75) Inventors: Iam Keong Sou; Zhaohui Ma, both of Kowloon; Choi Lai Man, New Territories; Zhi Yu Yang, Kowloon; Kam Sang Wong, Kowloon; George Ke-Lun Wong, Kowloon, all of (HK)

(73) Assignee: The Hong Kong University of Science & Technology, Hong Kong (HK)

( * ) Notice: Subject to any disclaimer, the term of this patent is extended or adjusted under 35 U.S.C. 154(b) by 0 days.

(21) Appl. No.: 09/222,707

(22) Filed: Dec. 29, 1998

(51) Int. Cl.[7] .................. G01J 5/20; H01L 31/0272
(52) U.S. Cl. .............. 250/372; 438/57; 438/84; 438/92; 438/95; 257/431; 257/442; 257/449
(58) Field of Search .............. 250/372; 438/57, 438/72, 73, 84, 92, 93, 95; 257/431, 437, 85, 184, 189, 76, 78, 442, 449

(56) References Cited

U.S. PATENT DOCUMENTS

| | | | | |
|---|---|---|---|---|
| 4,096,387 A | * | 6/1978 | Buckley | 250/372 |
| 5,278,856 A | * | 1/1994 | Migita et al. | 372/45 |
| 5,499,599 A | * | 3/1996 | Lowndes et al. | 117/50 |
| 5,540,786 A | * | 7/1996 | Xu et al. | 148/33.4 |
| 5,610,405 A | * | 3/1997 | Inushima et al. | 250/372 |
| 5,610,413 A | * | 3/1997 | Fan et al. | 257/97 |
| 6,104,074 A | * | 8/2000 | Chen | 257/453 |
| 6,107,652 A | * | 8/2000 | Scabennec et al. | 257/184 |
| 6,147,391 A | * | 11/2000 | Bowers et al. | 257/458 |
| 6,222,200 B1 | * | 4/2001 | Svilans | 257/18 |

* cited by examiner

Primary Examiner—Constantine Hannaher
Assistant Examiner—Albert Gagliardi
(74) Attorney, Agent, or Firm—Burns, Doane, Swecker & Mathis, L.L.P.

(57) ABSTRACT

Visible-blind UV detectors are disclosed comprising an active layer of ZnSTe alloy. The Te composition can be varied to provide good lattice matching depending on the nature of the substrate (eg Si, GaP or GaAs) and a novel structure is provided to give high quantum efficiency. The invention also discloses UV detectors with an active layer of pure ZnS and with an active layer of ZnSSe.

5 Claims, 9 Drawing Sheets

VISIBLE-BLIND UV DETECTORS

FIELD OF THE INVENTION

This invention relates to ultra-violet (UV) detectors, and in particular visible-blind UV detectors comprising II–VI alloys as the active material.

BACKGROUND OF THE INVENTION AND PRIOR ART

UV detectors with high responsivities for wavelengths shorter than 400 nm are very important for applications such as flame monitoring, pollutant detection and UV astronomy, as well as for advance medical techniques and instrumentation. Conventionally two types of devices have been used for UV detectors: photo-multiplier tubes and silicon p-i-n photodiodes.

Conventional photo-multiplier tubes have been satisfactory in the past, but in an increasing number of applications silicon p-i-n photodiodes have been preferred because of their low size and low voltage operation in spite of having a lower quantum efficiency. In recent years there has also been an increasing interest in developing GaAlN alloys and SiC thin films for visible-blind and solar-blind UV detection applications. Compared to SiC, GaAlN has a number of advantages: (1) it is a direct bandgap material and hence has a higher absorption coefficient, (2) it has a sharper cut-off, and (3) the doping control in the material is sufficiently well-developed that heterojunction devices are now possible, which will result in improved quantum efficiency. In addition the band-gap energy of GaAlN alloys spans the range from 3.4 to 6.2 eV making it possible to tailor the detector to have a specific long-wavelength cut-off between ~3600 Å and ~2000 Å. Several GaN—GaAlN based photoconductors and photodiodes of both Schottky and p-i-n junction types and having good performance have been successfully fabricated. More recently still a high gain GaN/AlGaN heterojunction phototransistor has been demonstrated. The highest external quantum efficiency achieved is around 70% at 355 nm.

However a problem with previous semi-conductor based UV photodetectors is the lack of a suitable lattice-matched substrate. The most commonly used substrate, sapphire ($Al_2O_3$), is lattice-mismatched to the nitrides by ~14% and has a thermal expansion coefficient that is almost twice as large as that of GaN. As a result, a high density of misfit dislocations and traps is inevitably present in these structures which severely limits the response time of the detectors. For example the fastest reported response time for a 250×250 μm GaN photodiode is still of the order of microseconds. It is also difficult to integrate nitride-based photodetectors with Si technology. The lattice mismatch between GaN and Si is even greater (18.7% between cubic GaN and Si) and thus so far there are no reports of good performance GaN based devices grown on a Si substrate.

SUMMARY OF THE INVENTION

According to the present invention there is provided a UV detector comprising $ZnS_{1-x}Te_x$ alloy as the active material. The proportion of Te in the alloy may be varied to provide good lattice matching to a substrate and will depend on the substrate chosen, but preferably $0 \leq x \leq 0.1$. Possible substrate materials are doped or undoped GaAs, Si or GaP. The active layer may de a doped layer, for example n-type doped ZnSTe:Al, or may be a layer of intrinsic ZnSTe.

In a first preferred embodiment the detector is a Schottky barrier structure comprising: (a) a substrate layer of $n^+$-type Si, GaAs or GaP, (b) an active layer of doped or undoped $ZnS_{1-x}Te_x$ formed on a first upper surface of the substrate layer, (c) a layer of a first conducting material formed on the surface of the active layer as a first electrode, and (d) a second conducting material formed on a second lower surface of the substrate as an Ohmic contact.

Preferably an upper surface of the detector is formed with an anti-reflection coating. This increases the quantum efficiency of the detector by minimising reflection losses.

In some circumstances this structure may however have a relatively low quantum efficiency caused by the Ohmic contact being located beneath the substrate and because carriers may therefore be trapped at the junction between the substrate and the active layer. Therefore in a more preferred embodiment the detector is a Schottky barrier structure comprising: (a) a substrate layer of GaAs, Si or GaP, (b) a first layer of Al doped $ZnS_{1-x}Te_x$ formed on a first upper surface of the substrate layer, (c) a second active layer of $ZnS_{1-x}Te_x$ formed on the surface of the first layer and only partially covering the first layer so as to leave a part of the first layer exposed, (d) a layer of first conducting material formed on the surface of the second active layer so as to form a first electrode, and (e) an Ohmic contact formed on the exposed part of the surface of the first active layer.

Preferably this structure is made with a substrate of Si or GaP. The material for the first electrode is preferably gold, while the Ohmic contact may be formed of at least one indium pellet. With a substrate of Si the Te composition may be such that x=0.03, while if the substrate is GaP preferably x=0.06, in both cases x being chosen to achieve good lattice matching between the substrate and the active layer.

This embodiment of the invention may be formed by (a) depositing a first layer of Al doped $ZnS_{1-x}Te_x$ by molecular beam epitaxy on a first upper surface of a substrate of GaAs, Si or GaP, (b) depositing a second active layer of $ZnS_{1-x}Te_x$ by molecular beam epitaxy on the surface of the first layer, (c) removing a portion of the second active layer by means of chemical etching to expose a part of the first layer, (d) depositing a first conductive material on the second active layer as a first electrode, and (e) forming an Ohmic contact on the exposed part of the first layer.

However, the wet chemical etching can have deleterious effects and so another method of forming the detector is by (a) depositing a first layer of Al doped $ZnS_{1-x}Te_x$ by molecular beam epitaxy on a first upper surface of a substrate of GaAs, Si or GaP, (b) applying to a part of the surface of the first layer a protective material to cover the part of the surface, (c) depositing a second active layer of $ZnS_{1-x}Te_x$ by molecular beam epitaxy on the surface of the first layer not covered by the protective material, (d) depositing a first conductive material on the second active layer as a first electrode, and (e) forming an Ohmic contact on the exposed part of said first layer.

In addition to ZnSTe-based UV photodetectors, the present invention also relates to UV photodetectors comprising other II–VI alloys as the active material, and in particular to a UV photodetector comprising $ZnS_{1-x}Se_x$ as the active material. The ZnSSe photodetector may be formed using the same techniques and with the same structure as for the ZnSTe-based photodetectors. Again, the proportion of Se may be chosen to provide good lattice matching with the substrate material, but preferably $0 \leq x \leq 0.5$, and more preferably still x=0.5.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
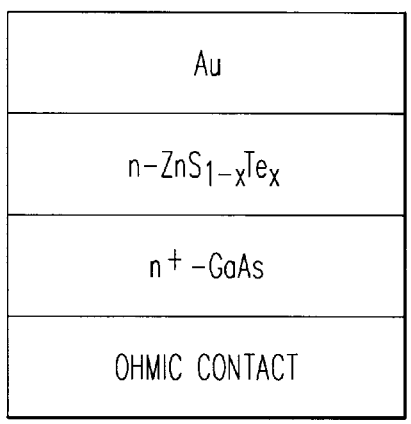
FIG. 1 shows in sectional view a UV photodetector structure according to a first embodiment of the invention.

A first embodiment of the invention is shown in FIG. 1. An active layer comprising a doped $ZnS_{1-x}Te_x$ thin film is grown on a n$^+$-GaAs (100) substrate in a VG V80H MBE system using ZnS and ZnTe compound sources contained in separate effusion cells. A third effusion cell containing Al was used as the n-type dopant source. The active layer is grown to a thickness of 5000 Å with a Te composition of 4%. A 100–200 Å thick Au layer was deposited on the top of the active ZnSTe layer by rf sputtering or thermal evaporation techniques to form the transparent top electrode. Samples of the thus formed detector materials were then mounted on a copper sample holder using conductive silver ink for measurements such that the Ohmic contact is formed underneath the GaAs substrate.

Figure 2:
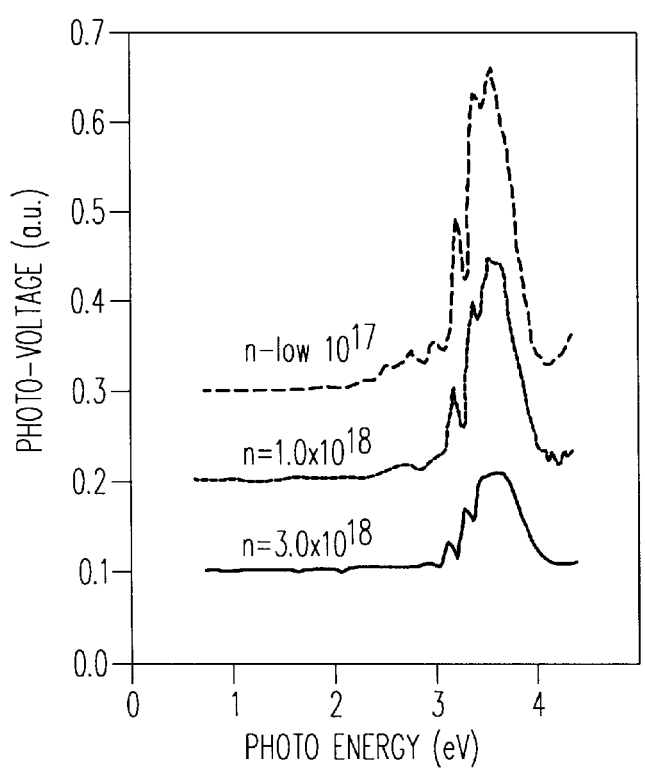
FIG. 2 shows the photovoltage response of the embodiment of FIG. 1 as a function of incident wavelength for three levels of dopant concentration.
Figure 3:
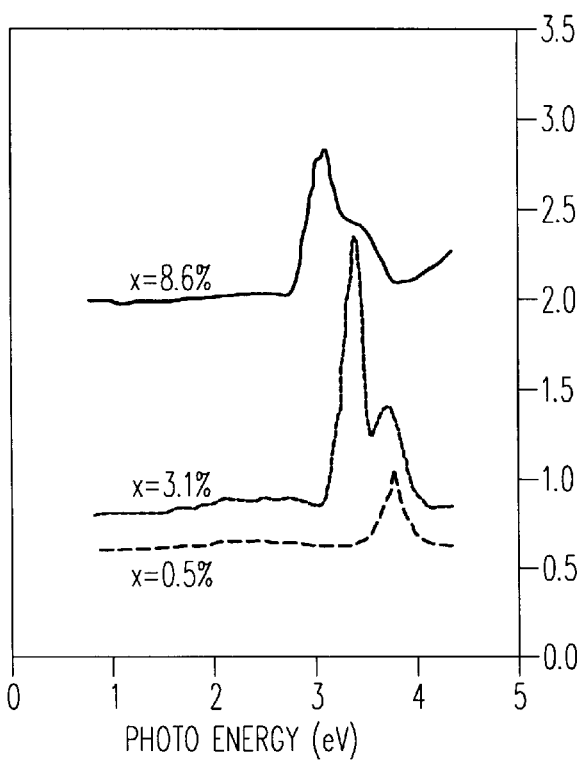
FIG. 3 shows the photovoltage response of the embodiment of FIG. 1 as a function of incident wavelength for three levels of Te composition.

In operation of this embodiment of a photodetector electron-hole pairs are generated by photons incident on the ZnSTe layer and are driven by the built-in electric field in the depletion region in opposite directions to form an output voltage across the diode. This output photovoltage is dependent on the energy of the incident photons. FIG. 2 shows the response of the detector as a function of photon energy for three levels of Al doping (Te is 4%, ie x=0.04), while FIG. 3 shows the response for three different Te fractions.

Referring firstly to FIG. 2 it will be seen that the response is basically visible-blind and UV sensitive. The response in the photon energy range below the band gap of the active ZnSTe layer (ie below about 3.5 eV) is probably due to absorption in the GaAs layer and the oscillating feature is the result of an interference effect caused by the ZnSTe layer. The drop-off at high photon energies is due to the short absorption length of the photons with energy larger than the band gap, making surface recombination effects important.

It can be seen from FIG. 2 that the photovoltage increases with decreasing doping concentration. FIG. 3 shows a plot corresponding to FIG. 2 but for active layers consisting of an intrinsic ZnSTe layer (ie without an Al dopant) for three values of x (8.6%, 3.1% and 0.5%) and it can be seen that the response is higher.

It will be seen therefore that the embodiment of FIG. 1 provides a UV photodetector that is visible blind. However, the embodiment of FIG. 1 is not preferred as measurements of the quantum efficiency of photodetectors made in accordance with the embodiment of FIG. 1 show that the efficiency is low. This is because the Ohmic contact is made through the GaAs substrate and there is a high density of misfit dislocations at the interface between the n$^+$-GaAs substrate and the active ZnSTe layer. A large proportion of the photogenerated carriers therefore become trapped at this interface. This problem may be partially overcome by using as the substrate a material such as GaP or Si that has a better lattice match to the active ZnSTe layer.

Figure 4:
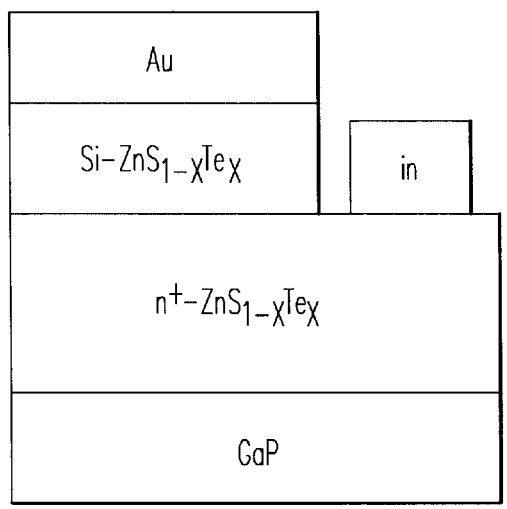
FIG. 4 shows in sectional view a UV photodetector structure according to a second embodiment of the invention.

FIG. 4 illustrates a second embodiment of the invention that provides an alternative approach to the problem of absorption at the junction between the active layer and the substrate. In this embodiment the Ohmic contact is not formed beneath the substrate, but is instead formed on an upper surface of the second electrode layer. In this embodiment a 1.5 μm heavily doped n$^+$-$ZnS_{1-x}Te_x$:Al layer with a carrier concentration of of the order of $1 \times 10^{19}$ cm$^{-3}$ was grown on a GaP substrate. This was followed by the growth of a 1.5 μm homoepitaxial layer of intrinsic $ZnS_{1-x}Te_x$. A thin layer of Au was then deposited on the top surface to form the Schottky barrier. Wet chemical etching (using for example a Br—$C_2H_6O_2$ solution) then applied to selected areas defined by photolithography to etch down to the n$^+$-$ZnS_{1-x}Te_x$:Al layer to which an Indium pellet was soldered to form the Ohmic contact.

Figure 5:
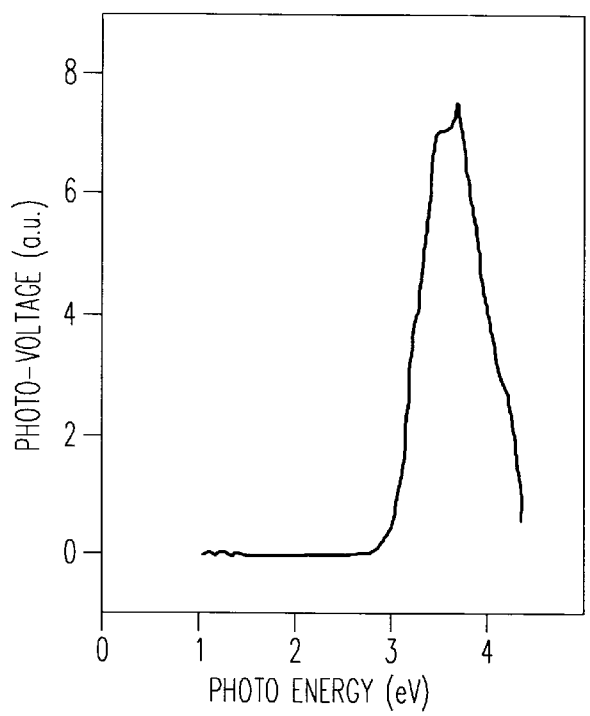
FIG. 5 shows the photovoltage response of the embodiment of FIG. 4 as a function of incident photon energy.

The Te composition can preferably be chosen so that the lattice constant of the two epilayers matches that of the GaP substrate, for example the Te composition may be 6% (ie x=0.06). This ensures that very few misfit dislocations are formed throughout the entire structure. Furthermore since the Ohmic contact is formed onto a top surface of the n$^+$-$ZnS_{1-}Te_x$ layer any deleterious effects that the interfacial defects can have on the device response is greatly reduced. In addition this embodiment minimizes the below-band-edge response due to absorption in the lower band-gap substrate. FIG. 5 shows the photovoltage output of this embodiment as a function of photon energy and a sharp onset at the band gap edge can be clearly seen as well as an absence of any oscillation.

Figure 6:
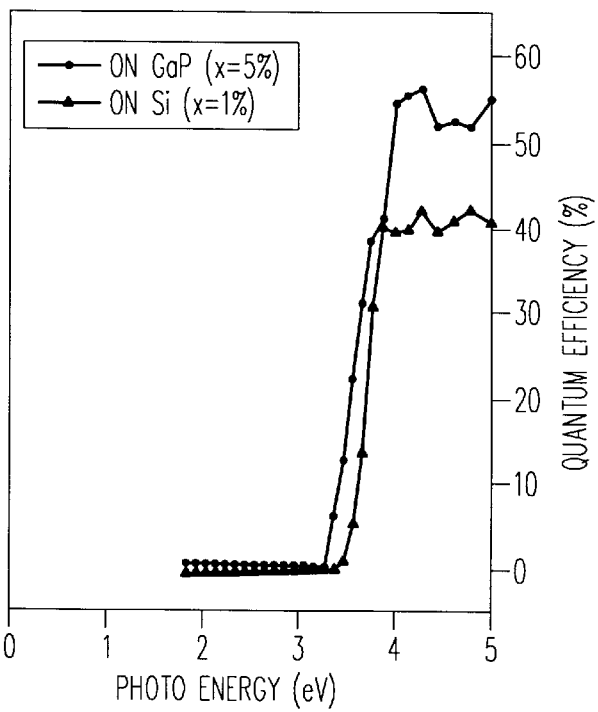
FIG. 6 shows the quantum efficiency of the embodiment of FIG. 4 as a function of incident photon energy.

FIG. 6 shows the quantum efficiency of this second embodiment measured using a Hg arc lamp and is shown as a function of photon energy. FIG. 6 shows that there is a flat sensitivity after the onset and a maximum efficiency of over 50%. This corresponds to a responsivity of 0.14 A/W in the UV region and is comparable to that of commercially available UV-enhanced Si photodiodes.

A second curve in FIG. 6 shows the quantum efficiency of a second example of the second embodiment formed on a Si substrate with a Te content of 1% (x=0.01). The onset of the response is blue-shifted when compared to that of the embodiment grown on GaP owing to the difference in Te composition, and the measured peak efficiency is slightly lower but is still over 40%.

The efficiency of these embodiments can be increased further by applying an anti-reflection coating since reflection loss is itself a significant factor in reduced quantum efficiency. A possible material for such a coating is a thin layer of silver (Ag).

Although the detectors of the embodiment of FIG. 4 show good results, a potential disadvantage of this embodiment is that the wet-chemical etching process may leave a damaged or roughened surface that makes the formation of the Ohmic contact an erratic process. In a third embodiment of the invention this potential disadvantage can be avoided by using a two-step growth approach that obviates the need to use wet chemical etching.

Figure 7:
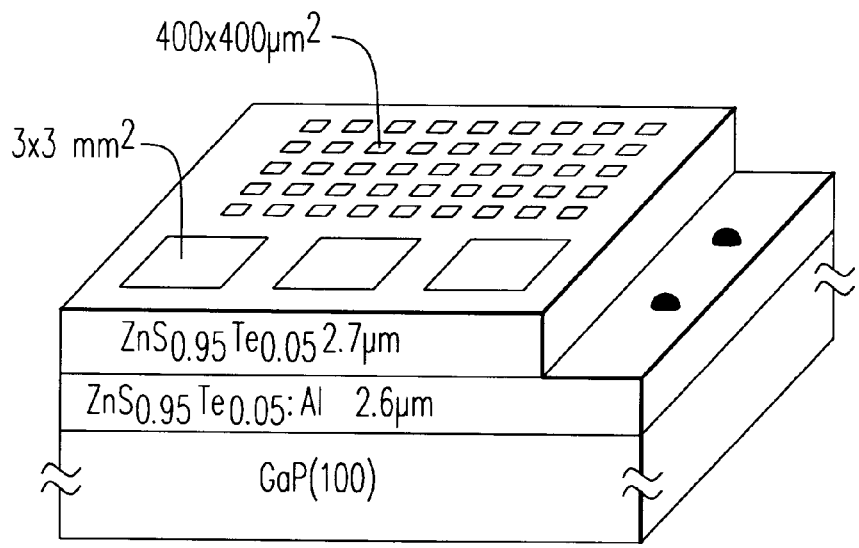
FIG. 7 is a perspective view of a UV photodetector according to a third embodiment of the invention.

FIG. 7 shows a structure made in accordance with this third embodiment of the invention. The structure is grown on a GaP (100) substrate in a VG V80H molecular beam epitaxy (MBE) system using ZnS and ZnTe compound source contained in separate effusion cells. A third effusion cell containing Al is used as the n-type dopant source. A two-step MBE growth approach is used to fabricate the structure. The first step consists of the growth of a 2.6 $\mu$m thick $ZnS_{1-x}Te_x$:Al (where x≈0.05) layer at 300° C. with an Al dopant level giving an electron carrier concentration n≈1×10$^{19}$ cm$^{-3}$. This first step is followed by the deposition at around 50° C. of a Se protection layer a few tens of nanometers thick. The sample was then removed from the growth system and thin tantalum strips with a width of about 3 mm were then placed on the sample to partially cover its surface. The two ends of the tantalum strips were held fixed on the sample holder using molten gallium.

The sample was then reloaded into the growth chamber and heated back to the optimized growth temperature of around 300° C. and the Se protection layer is removed by desorption which occurs at around 150° C. and in a second growth step a 2.7 $\mu$m thick undoped ZnSTe layer with the same Te proportion was deposited on top of the Se-desorbed surface.

The tantalum strips serve to protect the first grown doped epilayer such that the second layer is not grown thereon during the second growth step. The as-grown sample may therefore be removed from the growth chamber and the tantalum strips may be removed to reveal the first ZnSTe:Al layer and a pair of indium pellets may be soldered onto this layer and then subject to pulsed current blasting to provide the Ohmic contact. A 100 Å thick Au layer is deposited by thermal evaporation techniques on the undoped ZnSTe layer. Arrays of cells may be formed on the resulting detector structure to facilitate performance measurements, but would not necessarily be provided in an actual photodetector structures.

Figure 8:
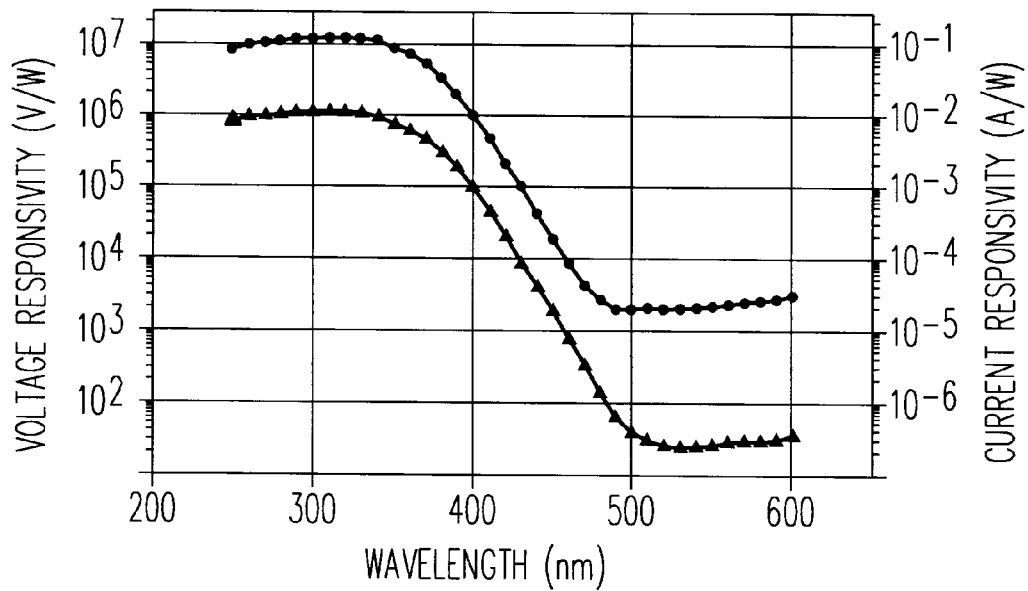
FIG. 8 shows the photocurrent and photovoltage responsivities of the detector of the embodiment of FIG. 7 as a function of incident wavelength.

FIG. 8 shows the photocurrent and photovoltage responsivities of the detector structure of FIG. 7 as measured on 3×3 mm$^2$ squares formed on the upper surface of the detector structure. The measurements were taken using a 150 W xenon arc lamp as the source. The response shows an onset at a wavelength corresponding to the energy of the band edge and reaches a value as high as 0.13 A/W for shorter wavelengths. This corresponds to an external quantum efficiency as high as 50% in the UV region, and as in the previous embodiment since there will be a substantial (around 30%) loss due to reflection, the efficiency can be increased still further by applying an anti-reflection coating to the detector surface. For wavelengths longer than 460 nm the sensitivity is reduced from the peak at 320 nm by three orders of magnitude, which shows that the photodetector structure of this embodiment has excellent visible-blind characteristics.

Figure 9:
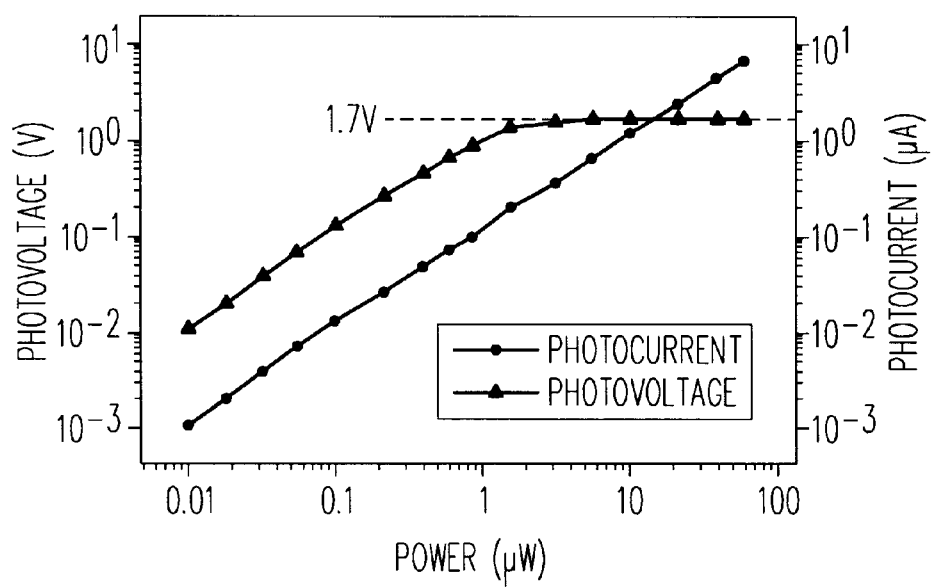
FIG. 9 shows the photocurrent and photovoltage as a function of incident power at the peak responsivity wavelength of the detector of the embodiment of FIG. 7.

FIG. 9 shows the photocurrent and photovoltage as a function of incident power at the peak response wavelength of 320 nm using a variable neutral density filter to vary the incident power. It can be seen that the photocurrent maintains good linearity over four orders of magnitude increasing with increasing incident power. In contrast the photovoltage shows an expected saturation voltage at about 1.7V.

Figure 10:
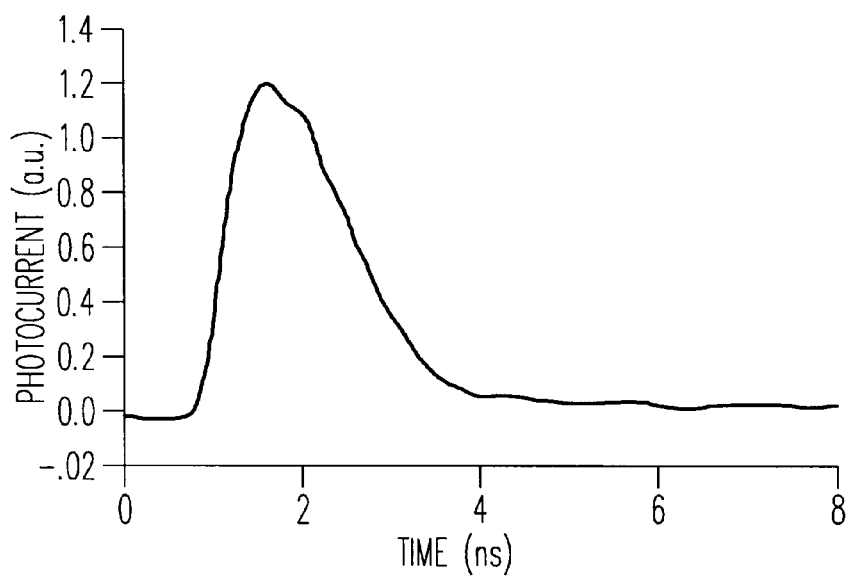
FIG. 10 shows the response time of the UV detector of the embodiment of FIG. 7.

The response time can also be determined with the photodetector structure of this embodiment. FIG. 10 shows the response as a function of time of one of the 400×400 $\mu$m$^2$ cells. From this it can be seen that the response time is of the order of a nanosecond which contrasts very favourably with known response times of the order of microseconds for conventional photodetectors of GaN materials.

Figure 11:
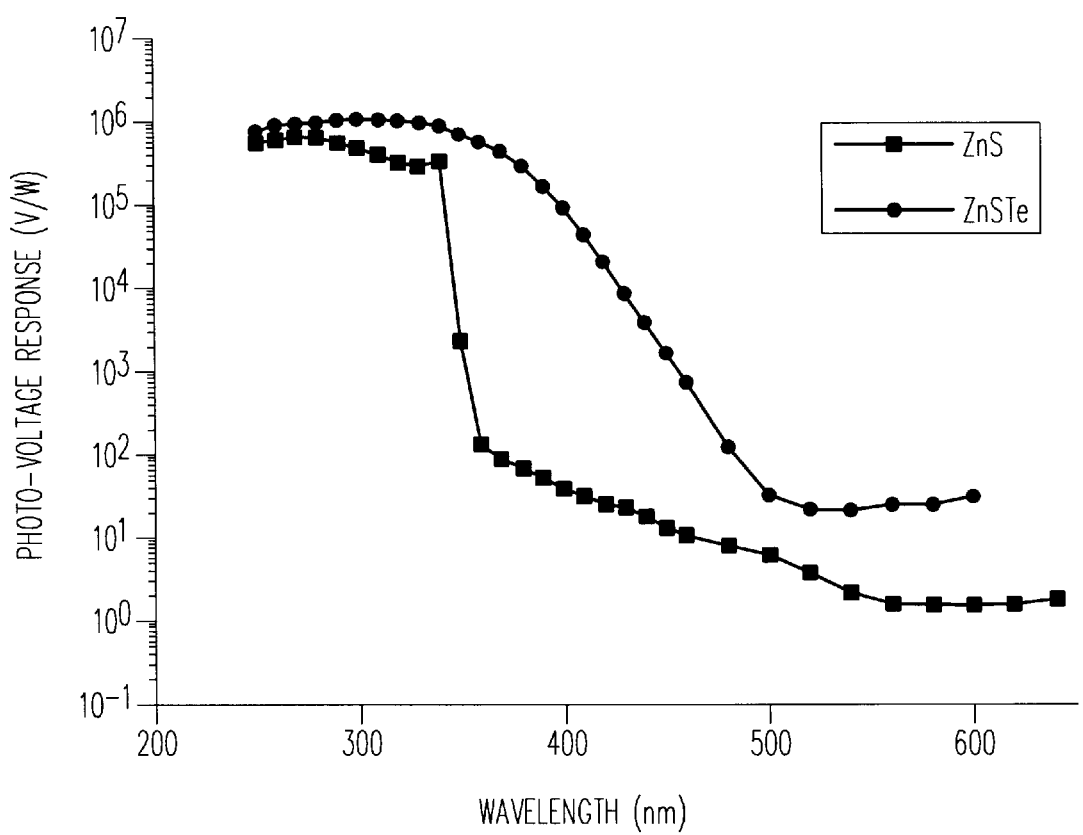
FIG. 11 is a plot comparing the response of a detector comprising an active layer of ZnSTe and a detector having an active layer of ZnS.

FIG. 11 illustrates another possible embodiment in which in the embodiments of FIGS. 4 & 7 the active layer comprises ZnS, ie the Te content is 0% (x=0). As can be seen from FIG. 11 having an active layer of pure ZnS provides a sharper response.

Figure 12:
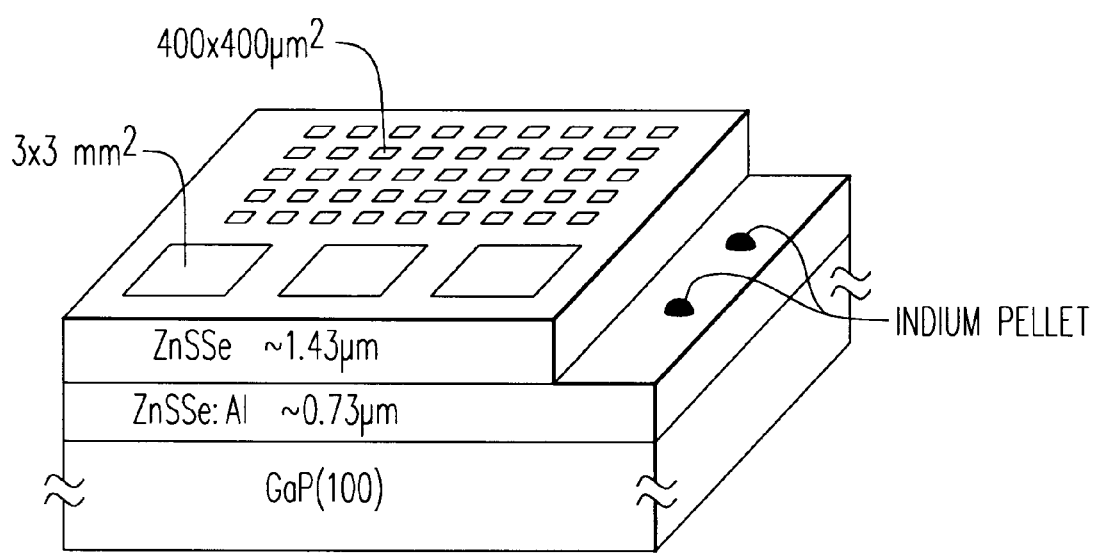
FIG. 12 is a perspective view of a UV photodetector according to a fourth embodiment of the invention.

FIG. 12 is a perspective view of a fourth embodiment of the invention and which has the same general structure as the embodiment of FIG. 7 but wherein the active layer comprises a layer of ZnSSe alloy. As in the embodiment of FIG. 7 the structure is grown on a GaP(100) substrate in a molecular beam epitaxy system using ZnS and ZnSe compound sources contained in separate effusion cells. A third effusion cell containing Al is used as the dopant source. As in the embodiment of FIG. 7 a two-step MBE growth approach is used, firstly to grow a 0.73 $\mu$m thick $ZnS_{1-x}Se_x$:Al layer where x=0.10 upon the GaP substrate. The doping concentration of this layer is such as to give a carrier concentration of 2.7×10$^{19}$cm$^{-3}$. As in the embodiment of FIG. 7 tantalum strips are added to parts of the surface of the first layer and then a second layer of $ZnS_{1-x}Se_x$ with x=0.10 is grown on the first layer to a thickness of 1.43 $\mu$m. The tantalum strips are removed and indium Ohmic contacts are formed on the upper surface of the first layer. As in the previous embodiments 3×3 mm$^2$ and 400×400 $\mu$m$^2$ test areas are defined on the upper surface of the detector for test purposes. Since for ZnSSe the composition of Se corresponding to a bandgap energy on the visible-UV boundary is 50%, for visible blind applications 0≦x≦0.5.

Figure 13:
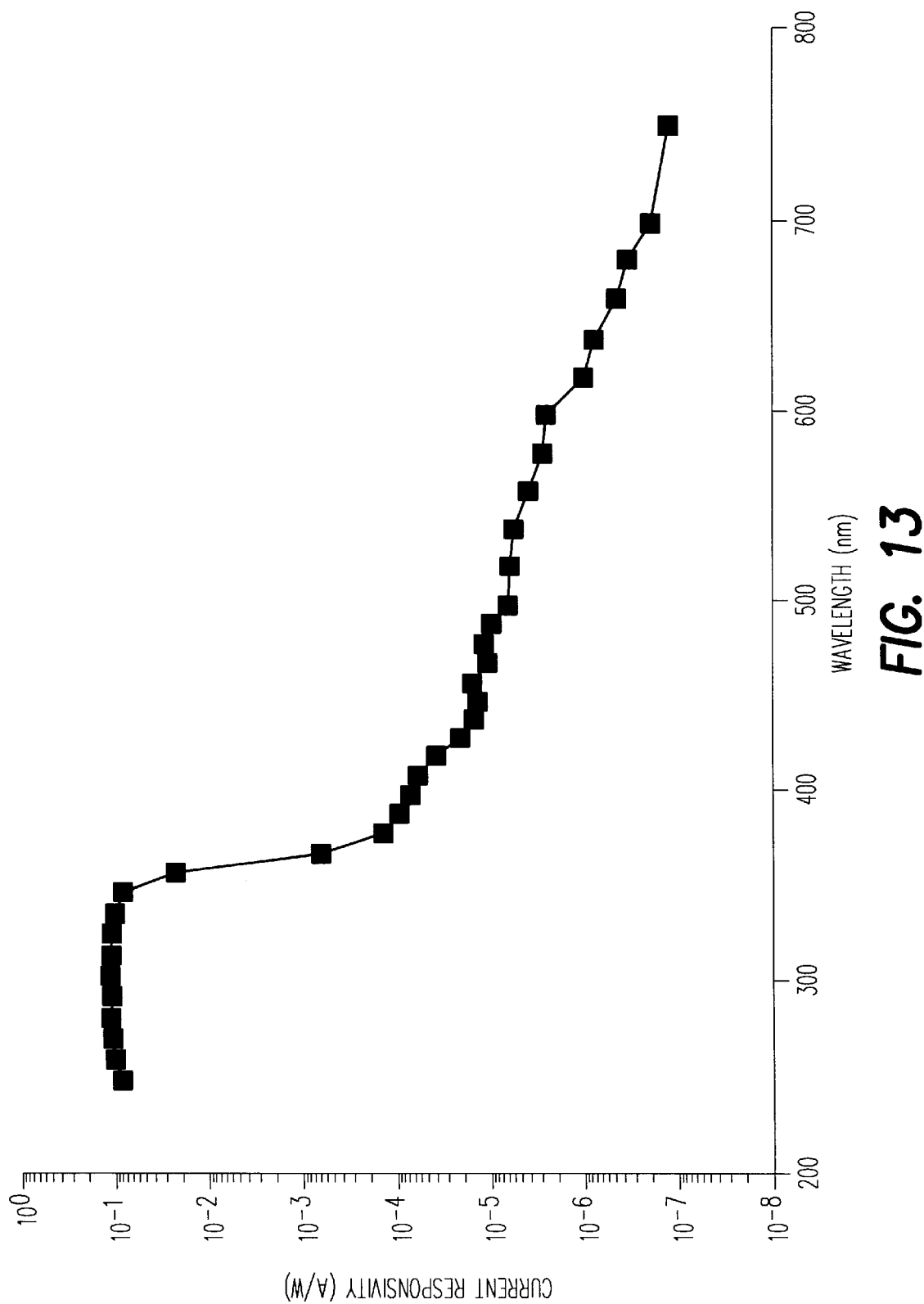
FIG. 13 is a plot of current responsivity against incident wavelength for the detector of FIG. 12.
Figure 14:
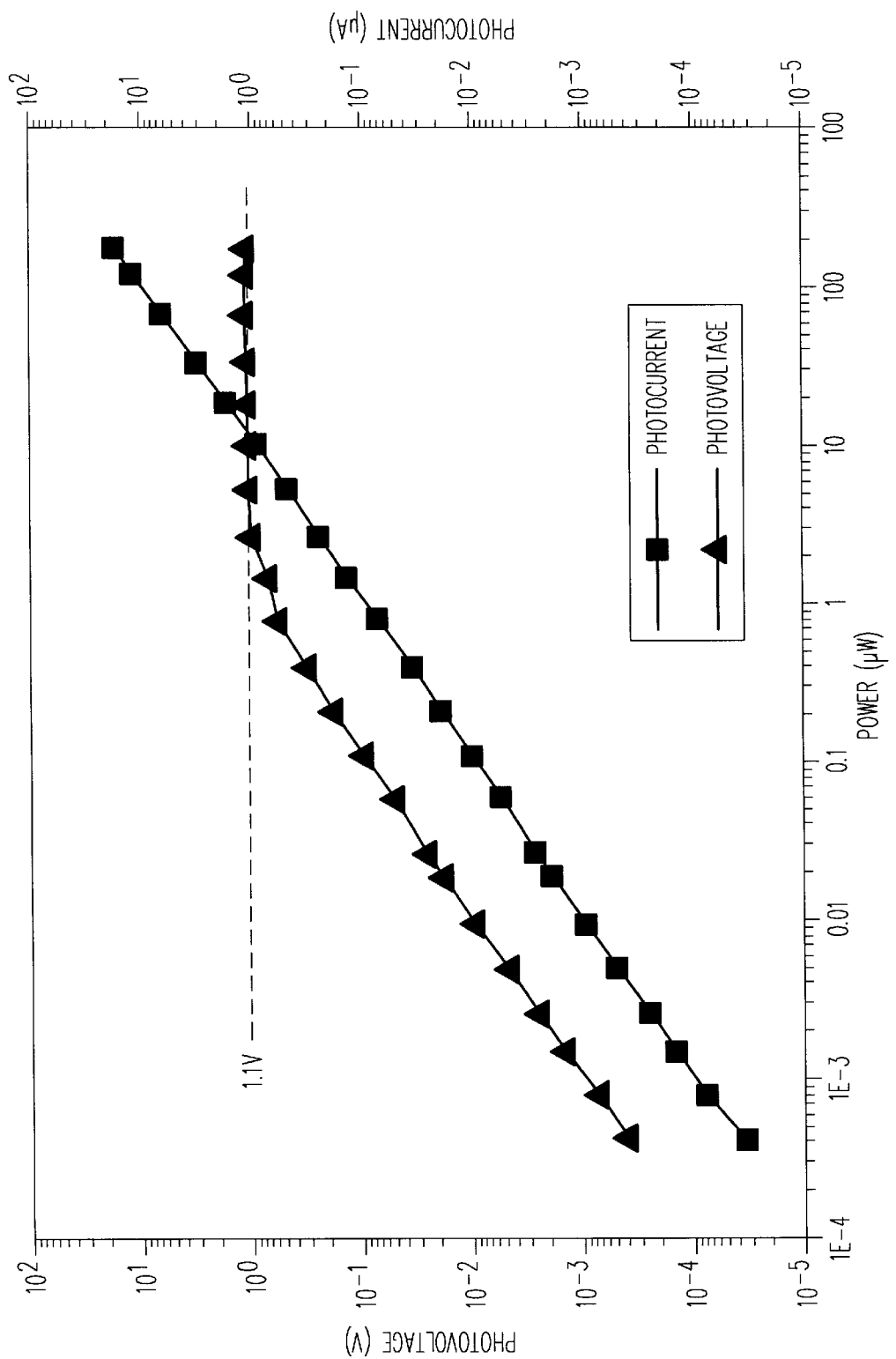
FIG. 14 is a plot of photocurrent and photovoltage against incident power of the UV detector of FIG. 12 at the peak responsivity wavelength.

FIG. 13 shows the photocurrent responsivity of the UV detector of FIG. 12. The results show a good visible-blind response with a sharp cutoff at around 350 nm. FIG. 14 shows the photocurrent and photovoltage measured as a function of incident power at the peak responsivity wavelength (340 nm). It can be seen that the photocurrent maintains good linearity over six orders of magnitude increasing with increasing incident power. In contrast the photovoltage shows an expected saturation at about 1.1V.

Thus it will be seen that the present invention provides novel photodiode based UV photodetector structures having good visible-blind properties, a high quantum efficiency and a fast response time and which can readily be incorporated into existing integrated circuit technologies.

What is claimed is:

1. A UV detector that is a Schottky barrier structure comprising:
   (a) a substrate layer of GaAs, Si or GaP,
   (b) a first layer of Al doped $ZnS_{1-x}Se_x$ formed on a first upper surface of said substrate layer, (c) a second active layer of $ZnS_{1-x}Se_x$ formed on the surface of said first layer and only partially covering said first layer so as to leave a part of said first layer exposed, (d) a layer of first conducting material formed on the surface of said second active layer so as to form a first electrode, and (e) an Ohmic contact formed on said exposed part of the surface of said first layer.

2. A UV detector as claimed in claim 1 wherein $0 \leq x \leq 0.5$.

3. A UV detector as claimed in claim 2 wherein $x=0.10$.

4. A method of forming a UV detector comprising the steps of:

(a) depositing a first layer of Al doped $ZnS_{1-x}Se_x$ by molecular beam epitaxy on a first upper surface of a substrate of GaAs, Si or GaP, (b) depositing a second active layer of $ZnS_{1-x}Se_x$ by molecular beam epitaxy on the surface of said first layer, (c) removing a portion of said second active layer by means of chemical etching to expose a part of said first layer, (d) depositing a first conductive material on said second active layer as a first electrode, and (e) forming an Ohmic contact on said exposed part of said first layer.

5. A method of forming a UV detector comprising the steps of:

(a) depositing a first layer of Al doped $ZnS_{1-x}Se_x$ by molecular beam epitaxy on a first upper surface of a substrate of GaAs, Si or GaP, (b) applying to a part of the surface of said first layer a protective material to cover said part of the surface, (c) depositing a second active layer of $ZnS_{1-x}Se_x$ by molecular beam epitaxy on the surface of said first layer not covered by said protective material, (d) depositing a first conductive material on said second active layer as a first electrode, and (e) forming an Ohmic contact on said exposed part of said first layer.

* * * * *